(12) United States Patent
Li et al.

(10) Patent No.: US 8,030,927 B2
(45) Date of Patent: Oct. 4, 2011

(54) MAGNET TEMPERATURE CONTROL DEVICE

(75) Inventors: An Feng Li, Shenzhen (CN); Xiao Guang Liu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 408 days.

(21) Appl. No.: 12/233,773

(22) Filed: Sep. 19, 2008

(65) Prior Publication Data
US 2009/0071626 A1 Mar. 19, 2009

(30) Foreign Application Priority Data
Sep. 19, 2007 (CN) .................. 2007 2 0178573 U

(51) Int. Cl.
*G01V 3/00* (2006.01)
(52) U.S. Cl. ......................................... 324/318
(58) Field of Classification Search .......... 324/300–322; 600/410–435
See application file for complete search history.

(56) References Cited

U.S. PATENT DOCUMENTS

| 5,652,517 A | 7/1997 | Maki et al. |
| 5,889,456 A * | 3/1999 | Triebe et al. .................. 335/300 |
| 7,449,889 B1 * | 11/2008 | Huang et al. .................. 324/318 |
| 7,741,847 B2 * | 6/2010 | Nakabayashi et al. ........ 324/320 |

OTHER PUBLICATIONS

Patent Abtracts of Japan Publication No. 03109042, for Japanese Application 01245121.

* cited by examiner

*Primary Examiner* — Dixomara Vargas
(74) *Attorney, Agent, or Firm* — Schiff Hardin LLP

(57) ABSTRACT

A magnet temperature control device, for use in a magnetic resonance system having a magnet, includes a pipeline and a temperature regulator. The pipeline is connected to a liquid or gas circulation, and the temperature regulator is connected in series in the pipeline to regulate the temperature of the liquid or gas. A part of the pipeline is arranged inside the magnet, while the rest of the pipeline is arranged outside said magnet; the part of said pipeline which is arranged inside said magnet is distributed uniformly within the magnet, and its cross-sectional shape is in an annular, helical, radicalized or network form, or a combination thereof. Compared to the use of a heater that is distributed only on the surface of the magnet, the pipeline distributed inside the magnet can control the magnet temperature more directly and effectively, so as to smooth and eliminate the temperature change of the magnet promptly by the liquid or gas flow therein, thereby making the magnet temperature more stable.

10 Claims, 2 Drawing Sheets

A-A

A-A

A-A

A-A

MAGNET TEMPERATURE CONTROL DEVICE

BACKGROUND OF THE INVENTION

1. Field of the Invention

The present invention relates to a magnet temperature control device, and in particular to a magnet temperature control device for a permanent magnet magnetic resonance system.

2. Description of the Prior Art

Referring to FIG. 1, in a typical permanent magnet magnetic resonance system, magnets 20, pole plates 30 are respectively arranged in turn on upper and lower magnetic yokes 10. Stability is an important parameter for the magnetic field components of a permanent magnet magnetic resonance system, although there exists a plurality of external factors that affect the stability of a permanent magnet, in which the temperature stability is the most important one. However, the magnetic components for permanent magnet magnetic resonance, in particular the magnets 20 for generating the magnetic field are very sensitive to temperature changes. The reason is that the characteristics of the permanent magnet material change considerably with the temperature, thus the magnetic field excited by it has corresponding changes, and such changes are shown as fluctuation in magnetic field density and deterioration in its uniformity, and the abovementioned changes in the magnetic field will directly result in a decrease of imaging quality of the magnetic resonance system.

Therefore, in a magnetic resonance system, in particular a permanent magnet magnetic resonance system, the stability of the main magnetic field depends on the temperature stability of the magnet itself. In order to keep the temperature stability of the magnet, U.S. Pat. No. 5,652,517 discloses a technology for heating the magnets by using AC and DC heaters. In this patent, the AC and DC heaters are distributed on side faces of both the upper and lower magnetic yokes of the magnets, and a temperature probe is disposed close to the center of the upper pole plate. The DC heater is used only at the initial stage of temperature increase; under normal operation, the magnet temperature depends on the temperature probe and the DC heater for its control and adjustment.

PCT application PCT/GB99/02778 discloses another technology for maintaining the magnets' temperature stability; and in this patent application, since it is considered that heat is continuously dissipated to the surrounding environment from the surface of the magnet, the magnet temperature is kept constant by placing a DC heater on the surface of the magnet.

Japanese application JP3109042 discloses a technology for controlling the magnet temperature by using oil circulation; in this patent application, a loop for heating the magnet is formed by an oil groove, a heater, an oil pump and oil pipes wound on a magnet; and the output power of the heater is controlled by detecting the temperature difference between the inlet oil pipe and the outlet oil pipe, so as to accomplish the object of maintaining the magnet's temperature stability.

However, in the abovementioned various solutions in the prior art, the magnet temperature is adjusted by mounting a heating device or a constant temperature device on the surface of the magnet, without taking into the account the case that the magnet itself generates heat which needs to be dissipated. When heat is generated inside the magnet, by way of adjusting the heater on the surface of the magnet alone it can only ensure the surface temperature of the magnet to be constant, while the temperature change inside the magnet will keep oscillating for quite a long time and it cannot be eliminated, thus resulting in the fluctuation of magnetic density and deterioration of uniformity, and damaging the imaging quality of the magnetic resonance system.

SUMMARY OF THE INVENTION

An object of the present invention is to provide a magnet temperature control device for keeping the temperature stability of the magnet, and in particular for keeping the temperature stability inside the magnet.

The above object is achieved in accordance with the present invention by a magnet temperature control device, for use in a magnetic resonance system having a magnet, wherein the magnet temperature control device has a pipeline and a temperature regulator; the pipeline having a liquid or gas circulating therein, and the temperature regulator being connected in series with the pipeline to regulate the temperature of the liquid or gas, and wherein a part of said pipeline is arranged inside the magnet, and the remaining part is arranged outside the magnet.

The part of said pipeline arranged inside the magnet is connected with the remaining part arranged outside the magnet through an inlet and an outlet respectively, so as to form a loop.

A temperature probe is arranged at the outlet of the pipeline for detecting the temperature of the liquid or gas flowing out of the part of the pipeline arranged inside said magnet. The temperature probe is connected to a controller, and feeds back the detected temperature value to the controller. The controller is connected to the temperature regulator, and controls the output power of the temperature regulator according to a temperature difference between the temperature value detected by the temperature probe and a preset temperature value of the liquid or gas to flow into the magnet.

The temperature regulator is connected in series in the remaining part of the pipeline arranged outside the magnet, and the temperature regulator is a heater and/or a cooler.

A pump is also connected in series in the remaining part of the pipeline arranged outside the magnet, for keeping the circulation of the liquid or gas in the pipeline, and preferably, said pump is arranged at a place close to the inlet of the pipeline.

The part of the pipeline arranged inside the magnets is distributed uniformly within the magnet, and the cross-sectional shape thereof is in an annular, helical, radialized or network form, or a combination thereof.

Compared with the prior art in which a heater is distributed only on the surface of a magnet, in the present invention the pipeline distributed inside the magnet can control the magnet temperature more directly and effectively, so as to smooth and eliminate a temperature change of the magnet promptly the liquid or gas flow therein, thereby making the magnet temperature more stable.

DESCRIPTION OF THE PREFERRED EMBODIMENTS

The basic concept of the present invention is to regulate, by a magnet temperature control device, the heat generated inside a magnet per se via a pipeline arranged inside the magnet of a permanent magnet magnetic resonance system, so as to smooth and eliminate a temperature change of the magnet promptly, and to ensure the temperature stability of the magnet.

Figure 1:
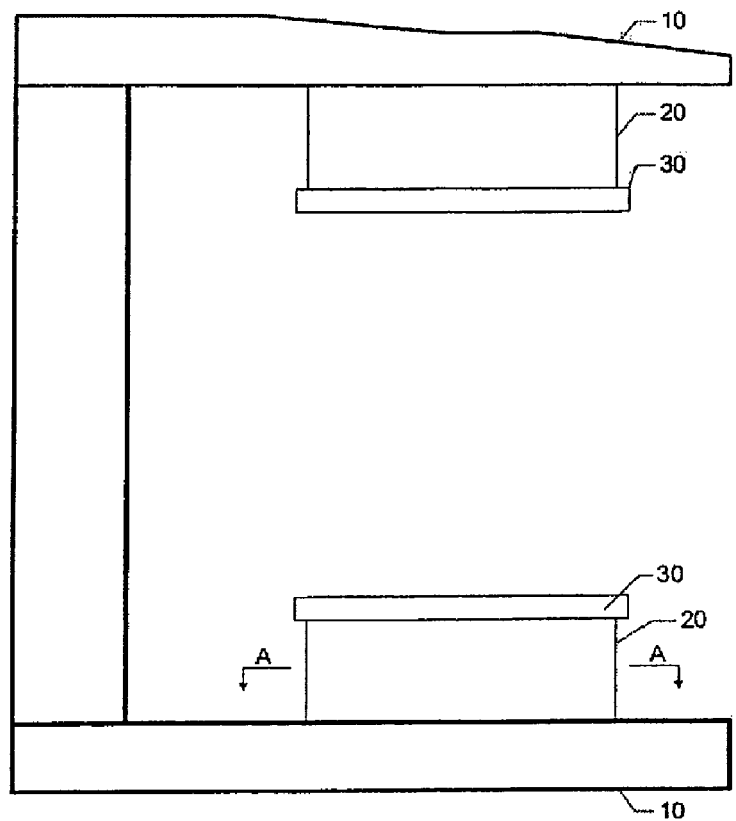
FIG. 1 is a schematic view of a current permanent magnet magnetic resonance system, formed by magnet yokes, magnets and magnetic poles.

The magnet temperature control device of the present invention is mainly for applications in permanent magnet magnetic resonance systems. As shown in FIG. 1, said permanent magnet magnetic resonance system comprises upper and lower magnetic yokes 10, and magnets 20 which in turn are arranged respectively on said upper and lower magnetic yokes 10.

Figure 2:
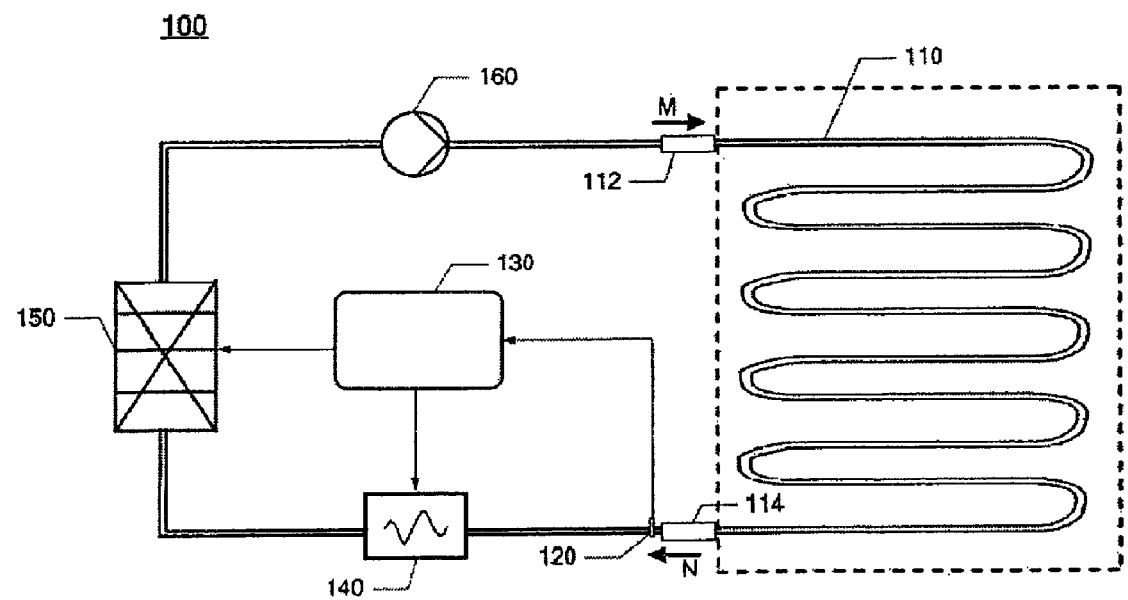
FIG. 2 is a schematic view of a magnet temperature control device of the present invention.
Figure 3A:
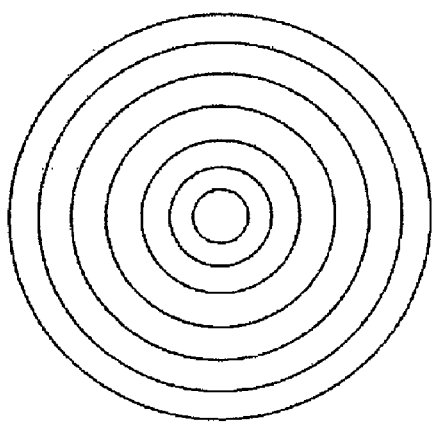
FIGS. 3A to 3D are sectional views in the A-A direction of a pipeline of the magnet temperature control device of the present invention arranged in the magnet pole of FIG. 1.
Figure 3B:
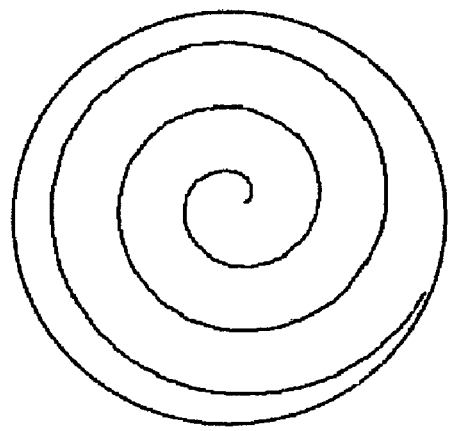
Figure 3C:
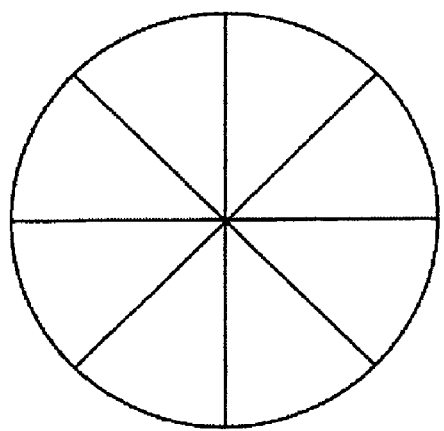
Figure 3D:
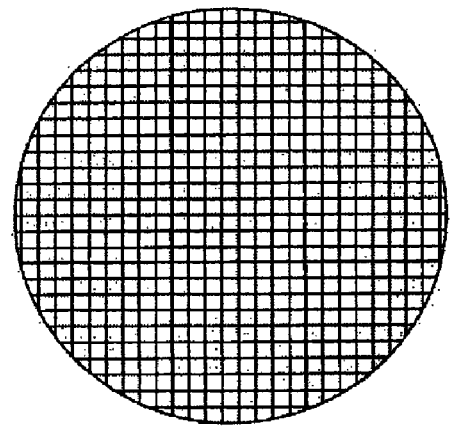

As shown in FIG. 2, the magnet temperature control device 100 of the present invention has a pipeline 110 and into the pipeline 110 is introduced a circulating liquid or gas flow. A part of said pipeline 110 (the part within the dash line box) is arranged inside said magnet 20 of the permanent magnet magnetic resonance system, while the remaining part is arranged outside said magnet 20.

The part of the pipeline 110 arranged inside the magnet 20 is connected with the remaining part of the pipeline 110 arranged outside the magnet 20 via an inlet 112 and an outlet 114 respectively to form a loop. A liquid or gas circulates through the pipeline 110 and flows into the inside of said magnet 20 in direction M at the inlet 112, and flows out of the magnet 20 in direction N at the outlet 114 after a heat exchange. A heater 140 and a cooler 150 or similar temperature regulators are connected in series in the remaining part of the pipeline 110 arranged outside the magnet 20, for regulating the temperature of the liquid or gas in the pipeline 110 by appropriately heating or cooling the liquid or gas. A pump 160 is also connected in series in the remaining part of the pipeline 110 arranged outside the magnet 20, for keeping the stable circulation of the liquid or gas in the pipeline 110. The pump 160 is preferably arranged at a place close to the inlet 112 of the pipeline 110.

A temperature probe 120 is arranged at the outlet 114 of the pipeline 110, for detecting the temperature of the liquid or gas flowing out of the part of the pipeline 110 arranged inside the magnet 20. The temperature probe 120 is connected with a controller 130, and feeds back the detected temperature values to the controller 130. The controller 130 is connected respectively with said heater 140 and cooler 150 connected in series in the pipeline 110, and controls the output power of the heater 140 and/or cooler 150 according to a temperature difference between the temperature value of the liquid or gas flowing out of the magnet 20 detected by said temperature probe 120 and a preset temperature value of the liquid or gas to flow into the magnet 20, so as to ensure that the temperature of the liquid or gas flowing into the inside of the magnet 20 at said inlet 112 of the pipeline 110 is at the set temperature value, and to further ensure a constant temperature of the magnet 20.

Referring to FIG. 1 and FIGS. 3A to 3D together, FIGS. 3A to 3D are respectively section views in the A-A direction of different embodiments in which the pipeline 110 of the magnet temperature control device 100 of the present invention is arranged in the magnet 20 of FIG. 1. The part of the pipeline 110 arranged inside the magnet 20 can be distributed in an annular, helical, radialized or network form, a combination of the above shapes or any other shape, as long as the shape is distributed uniformly inside the magnet 20. The advantage of uniform distribution of the above pipeline 110 inside the magnet 20 is that: when the magnet 20 per se generates heat, it can be absorbed uniformly and quickly by the liquid or gas in the pipeline 110 and carried away by its circulation, so as to keep the temperature of the magnet 20 stable; when the temperature of the magnet 20 decreases under external influence, the magnet 20 can be heated uniformly and quickly by the liquid or gas flowing in the pipeline 110, so as to ensure the stable temperature of the magnet 20.

When the magnet 20 operates, the temperature fluctuation of the magnet 20 caused by various reasons will bring about the temperature changes of the liquid or gas in the loop of said pipeline 110, and the temperature probe 120 will feed back to the controller 130 the temperature values of the liquid and gas detected at the outlet 114 of the pipeline 110. According to the temperature changes, the controller 130 sends a corresponding command to the heater 140 or cooler 150 connected in series in the pipeline 110 for carrying out heating or cooling. The temperature of the liquid or gas in the loop of the pipeline 110 is returned to the set value after having been heated or cooled and the liquid or gas is re-circulated into the magnet 20 by the pump 160, so as to ensure the stable temperature of the magnet 20.

Furthermore, the magnet temperature control device 100 of the present invention can also have a DC heater similar to that in the prior art arranged in the upper and lower magnetic yokes 10 of the permanent magnetic resonance system on their surfaces close to the magnets 20, for performing an initial temperature increase by heating on the magnets 20.

When performing the initial temperature increase by heating on the magnet 20, it is mainly by means of the DC heater which is arranged on the surface of the magnet 20 that heating is performed, while the liquid or gas in the pipeline 110 can assist the DC heater is performing the temperature increase. When the magnets are in normal operation, the DC heater can ensure that the magnet as a whole is in a state of heat balance; the pipeline 110 distributed inside the magnet can assure the precise heat balance of key parts inside the magnet 20 by the circulating liquid and gas, and particularly when a part of the magnet 20 generates the heat by itself or due to outside influences, the pipeline 110 can carry away the heat in time, thereby keeping the temperature of the magnet 20 constant.

In summary, compared with the prior art in which a heater is distributed only on the surface of a magnet, the pipeline distributed inside the magnet in the present invention can control the magnet temperature more directly and effectively, so as to smooth and eliminate a temperature change of the magnet promptly by the liquid or gas flow therein, thereby making the magnet temperature more stable.

Although modifications and changes may be suggested by those skilled in the art, it is the intention of the inventors to embody within the patent warranted hereon all changes and modifications as reasonably and properly come within the scope of their contribution to the art.

We claim as our invention:

1. A temperature controlled magnet device for use in a magnetic resonance system comprising:

a permanent magnet that generates a basic magnetic field having a strength and homogeneity that uniformly align nuclear spins in a subject when located in the basic magnetic field, said magnet having an exterior magnet surface that defines an interior of said magnet inside of said exterior surface; and a magnet temperature control device comprising a pipeline and a temperature regulator; said pipeline having a liquid or gas circulating therein, and a part of said pipeline being located in said interior inside said magnet, and a remaining part of said pipeline being located outside said magnet, said temperature regulator being connected in series with said pipeline to stabilize a temperature of said magnet by regulating a temperature of said liquid or gas in said pipeline in said interior inside said magnet.

2. The magnet temperature control device as claimed in claim 1, wherein the part of said pipeline arranged inside said magnet is connected to the remaining part arranged outside said magnet via an inlet and an outlet respectively, to form a loop.

3. The magnet temperature control device as claimed in claim 2, comprising a temperature probe located at the outlet of said pipeline that detect a temperature of the liquid or gas flowing out of the part of the pipeline arranged inside said magnet; a controller connected to said temperature probe that feeds back the detected temperature value to the controller; said controller being connected to said temperature regulator and being configured to control an output power of said temperature regulator according to a temperature difference between the temperature detected by said temperature probe and a preset temperature of the liquid or gas to flow into said magnet.

4. The magnet temperature control device as claimed in claim 3, wherein said temperature regulator is connected in series in the remaining part of said pipeline arranged outside said magnet.

5. The magnet temperature control device as claimed in claim 4, wherein said temperature regulator is a heater and/or a cooler.

6. The magnet temperature control device as claimed in claim 1, comprising a pump connected in series in the remaining part of said pipeline arranged outside said magnet, that keeps the liquid or gas circulating in the pipeline.

7. The magnet temperature control device as claimed in claim 6, wherein said pump is located adjacent to the inlet of said pipeline.

8. The magnet temperature control device as claimed in claim 7 the part of said pipeline inside said magnet is distributed uniformly within the magnet.

9. The magnet temperature control device as claimed in claim 8, wherein the part of said pipeline has a cross-sectional shape selected from the group consisting of inside said magnet annular, helical, radicalized, network and combinations thereof.

10. The magnet temperature control device as claimed in claim 1, comprising a DC heater which is arranged on a surface of said magnet.

* * * * *